United States Patent
Worledge

(10) Patent No.: US 7,205,163 B2
(45) Date of Patent: Apr. 17, 2007

(54) CURVATURE ANISOTROPY IN MAGNETIC BITS FOR A MAGNETIC RANDOM ACCESS MEMORY

(75) Inventor: Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 10/979,970

(22) Filed: Nov. 3, 2004

(65) Prior Publication Data

US 2005/0088905 A1    Apr. 28, 2005

Related U.S. Application Data

(62) Division of application No. 10/623,323, filed on Jul. 18, 2003, now Pat. No. 6,833,573.

(51) Int. Cl.
*H01L 21/00* (2006.01)
*H01L 29/76* (2006.01)

(52) U.S. Cl. .......................... 438/3; 257/295

(58) Field of Classification Search ................ 365/151, 365/158, 171, 189; 257/295–303; 438/3, 438/240
See application file for complete search history.

(56) References Cited

U.S. PATENT DOCUMENTS 6,621,731 B2 *   9/2003   Bessho et al. ............... 365/171
6,768,152 B2 *   7/2004   Higo ........................... 257/295

* cited by examiner

*Primary Examiner*—Calvin Lee
(74) *Attorney, Agent, or Firm*—Michael J. Buchenhorner; Ido Tuchman

(57) ABSTRACT

A magnetic memory cell that uses a curved magnetic region to create magnetic anisotropy is provided by the present invention. The magnetic memory cell is created from a free magnetic layer, a barrier layer and a reference magnetic layer. The magnetic layers are constructed such that they have portions that are curved with respect to a first axis and straight with respect to a second perpendicular axis. These curved portions result in a magnetic memory cell that has an easy axis that is parallel to the first axis and a hard axis that is perpendicular to the easy axis. In addition, the resulting magnetic memory cell's coercivity is independent of it's thickness. Thus, the magnetic memory cell is well adapted to being scaled down without increasing the likelihood of thermally induced errors.

3 Claims, 3 Drawing Sheets

CURVATURE ANISOTROPY IN MAGNETIC BITS FOR A MAGNETIC RANDOM ACCESS MEMORY

CROSS-REFERENCE TO RELATED APPLICATIONS

The present U.S. patent application is a divisional of U.S. patent application Ser. No. 10/623,323, filed on Jul. 18, 2003, Issued as U.S. Pat. No. 6,833,573, and entitled "Curvature Anisotropy in Magnetic Bits for a Magnetic Random Access Memory," which is hereby incorporated by reference in its entirety. The present U.S. patent application claims priority to the filing date of U.S. patent application Ser. No. 10/623,323.

FIELD OF THE INVENTION

The invention disclosed broadly relates to the field of computer memory. More particularly, preferred embodiments of the present invention relate to the use of curved magnetic regions to create the needed magnetic anisotropy and coercivity for memory cells in a magnetic random access memory.

BACKGROUND OF THE INVENTION

Magnetic memory cells are memory cells that store information in the orientation of the magnetization of a ferromagnetic region. These magnetic memory cells are nonvolatile and can hold stored information for long periods of time. Magnetic memory cells that use a magnetic state to alter the electrical resistance of the materials near the ferromagnetic region are collectively known as magnetoresistive (MR) memory cells. An array of magnetic memory cells is often called magnetic RAM or MRAM (magnetic random access memory). MRAM arrays include an array of magnetic memory cells positioned at the intersections of wordlines and bitlines. Each cell includes a magnetically changeable or free region and a proximate reference region arranged into a magnetic tunnel junction ("MTJ") device. The principle underlying storage of data in such cells is the ability to change the relative orientation of the magnetization of the free and reference regions by changing the direction of magnetization along the easy axis ("EA") of the free region, and the ability to thereafter read this relative orientation difference. More particularly, MRAM cells are written to by reversing the free region magnetization using applied bi-directional electrical, and resultant magnetic, stimuli via its respective bitline and wordline, and are later read by measuring the resultant tunneling resistance between the bitline and wordline. The tunneling resistance assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or –EA), and if the reference region is, for example, a similar elemental magnet but having a direction of magnetization fixed in the +EA direction, then two states (and therefore the two possible tunneling resistance values) are defined for the cell: aligned (+EA/+EA) and anti-aligned (–EA/+EA). These two states may be used to represent a logical 1 or 0 for typical binary processing applications.

Coercivity refers to the magnetic field strength required to alter the orientation of the magnetization in a magnetic memory cell. In an MRAM device, the bits should all have approximately the same coercivity so that they can all be altered using a magnetic field of approximately the same strength. In addition, it is important that a magnetic memory be designed such that when the bits are scaled to smaller dimensions they do not suffer from thermally activated switching errors due to a decrease in their volume. The traditional approach uses shape anisotropy to create this needed coercivity. Unfortunately, this approach suffers from several problems. First, it is difficult to pattern all of the junctions with exactly the same shape. This variance in the shapes of the junctions leads to a corresponding spread in the coercivities of the bits. Furthermore, large aspect ratios are required to create this shaped-induced anisotropy and the large aspect ratios of the shaped anisotropic bits decreases the density of an MRAM constructed out of the bits. Finally, as the bits are scaled down in area, the thickness of the bits must also decrease in order to maintain the required coercivity. This scaling down of the thickness of the bits results in a decrease in bit volume which increases the likelihood of thermally activated switching errors. Therefore, what is needed is an improved magnetic memory bit that has a substantially uniform coercivity and can be scaled down without introducing thermally activated switching errors.

SUMMARY OF THE INVENTION

A preferred embodiment of the present invention is directed toward a magnetic random access memory. The magnetic random access memory includes a plurality of magnetic memory cells. Each magnetic memory cell has a substrate, a reference layer, a barrier layer and a free layer having a hard axis and an easy axis. The substrate has a plurality of grooves that are substantially parallel to the easy axis of the free layer. A copper read or write wire is incorporated into at least one of the grooves such that the wire has a concave shape or a convex shape. At least a portion of the free layer is positioned on one of the grooves of the substrate to create a curved portion such that the free layer is curved with respect to the hard axis and substantially straight with respect to the easy axis. In a most preferred embodiment, the free layer comprises a shape of the arc of a circle. The reference layer is also preferably substantially curved with respect to the hard axis and substantially straight with respect to the easy axis. The barrier layer is positioned between the reference layer and the free layer.

Another embodiment of the present invention is directed toward an information processing system. The information processing system includes a processor, a memory and an input/output interface. The memory is preferably a magnetic random access memory having a substrate and a plurality of magnetic cells. Each magnetic cell has a magnetic region having an easy axis and a hard axis. The magnetic region includes a stack with a reference layer, a free layer and a barrier layer. The substrate has a plurality of grooves substantially parallel to the easy axis of the magnetic region. The magnetic region is substantially curved with respect to the hard axis and substantially straight with respect to the easy axis. Preferably, the magnetic region includes a curved free layer located over one of the grooves of the substrate. A wire for supplying read and write signals to the magnetic cells is incorporated into at least one of the grooves.

Yet another embodiment of the present invention is directed toward a method of producing a magnetic memory cell having a free layer, a barrier layer and a reference layer. In accordance with the method, the free layer is formed such that a portion of the free layer is curved. Preferably, the reference layer is also produced such that a portion of the reference layer is curved. This is accomplished by creating curved regions in a substrate layer by etching grooves in the substrate and depositing the free layer and reference layer over the curved regions to produce the curved portions. Read and write wires may also be formed in portions of the etched grooves.

The above described embodiments of the present invention substantially improve upon the prior art by providing magnetic memory cells that exhibit magnetic anisotropy, substantially uniform magnetic coercivities and are relatively easy and inexpensive to construct. In addition, the coercivity of a magnetic memory cell constructed in accordance with the above discussed embodiments is independent of the thickness of the memory cell. Thus, dense arrays of magnetic memory cells may be constructed in accordance with the preferred embodiments of the present invention without substantially decreasing their volume and, thereby, increasing the likelihood of thermally induced errors. Thus, the present invention is particularly well suited for use in applications where it is desirable to produce as small of a magnetic memory cell as possible.

DESCRIPTION OF THE PREFERRED EMBODIMENT

Figure 1A:
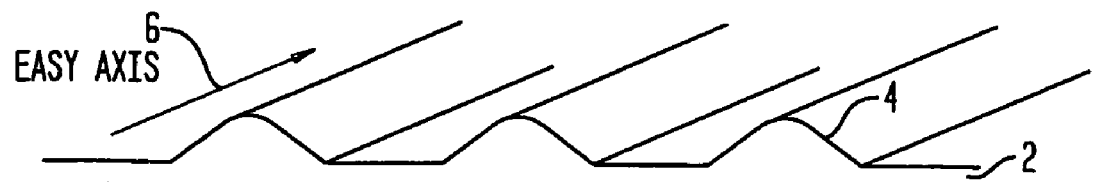
FIGS. 1(a) thru 1(c) are illustrations of a magnetic random-access memory cell constructed according to a preferred embodiment of the present invention.
Figure 1B:
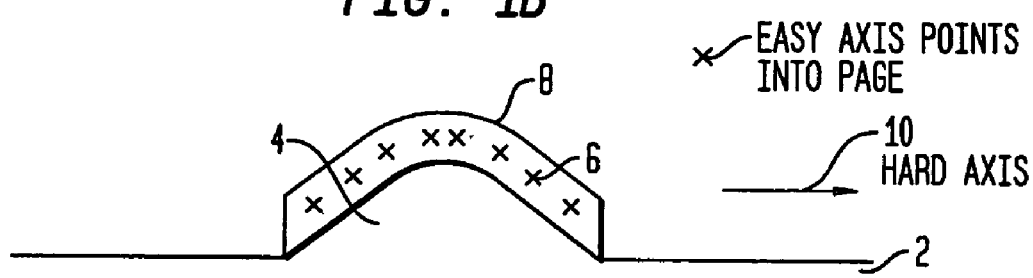

Instead of using shape to create anisotropy in a magnetic memory cell, preferred embodiments of the present invention use a curved free layer to provide a magnetic memory cell having a uni-axial magnetic anisotropy. For example, referring to FIGS. 1(a–c), there is shown a substrate 2 for a magnetic random-access memory cell that is curved in accordance with the present invention. More particularly, in FIG. 1(a), a substrate 2 for a magnetic memory cell is shown having grooves 4 etched along one axis 6 of the magnetic memory cell. The width of the grooves 4 is preferably as small as possible, but they should be at least as small as the diameter of any circular tunnel junction in connection with which they are used. The grooves 4 may be either concave or convex as long as a curved region is created on the substrate 2. When the stack that is used to construct the magnetic memory cell is placed on top of the curved portion 4 of the substrate 2, a hard axis 10 is created in the direction of the curve of the free layer 8. When the magnetization points along the hard axis 10, the magnetization is forced to curve along parallel to the free layer 8. This curving costs the magnetic field in the free layer 8 some exchange energy. It is this exchange energy that induces a uni-axial anisotropy in the magnetic memory cell. Conversely, when the magnetization runs parallel to the grooves 4, the magnetization is substantially straight and parallel throughout the free layer 8. Thus, an easy axis 6 is created that is perpendicular to the hard axis 10 by curving the free layer 8.

Figure 1C:
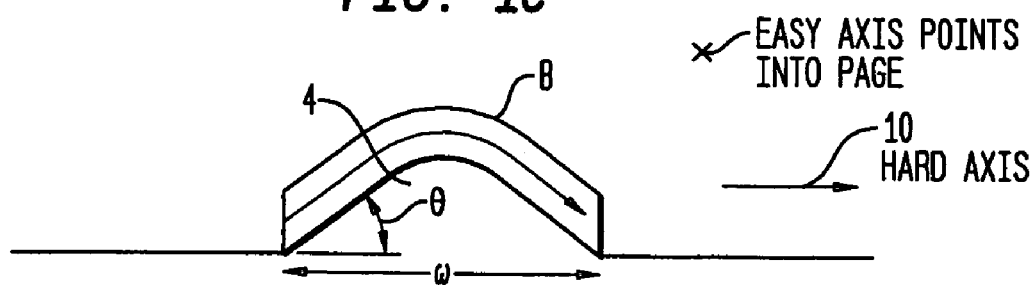

Referring now to FIG. 1(c), a simple coercivity calculation for the case where the free layer 8 takes the shape of an arc of a circle is shown. In such a case, the coercivity ($H_c$) of a circular bit is approximated by:

$$H_c = \frac{4A\theta\sin\theta}{M_s w^2}$$

Where $A=JS^2/a$ is the exchange constant; $\theta$ is the included angle of the arc, $M_s$ is the magnetization, w is the lithographic line width, J is the exchange integral, S is the spin, and a is the lattice constant. Taking $A=10^{-6}$ erg/cm, $\theta=30°$, $M_s=484$ emu/cm3 (Ni), and $w=0.1$ μm, we arrive at a coercivity, $H_c$, of 22 Oe. Thus, the use of a free layer 8 with a relatively moderate curvature is sufficient to create a large enough coercivity for use as a magnetic memory cell. Furthermore, the position of the lithographic line width, w, in the equation set forth above reveals that the smaller the tunnel junctions are constructed, the easier it is create the coercivity needed for a magnetic memory cell. As discussed in more detail below, this allows magnetic memory cells constructed in accordance with the present invention to be scaled down without increasing the likelihood of thermally induced errors. Thus, producing a magnetic memory cell with a curved free region is a substantial improvement upon the prior art.

Figure 2:
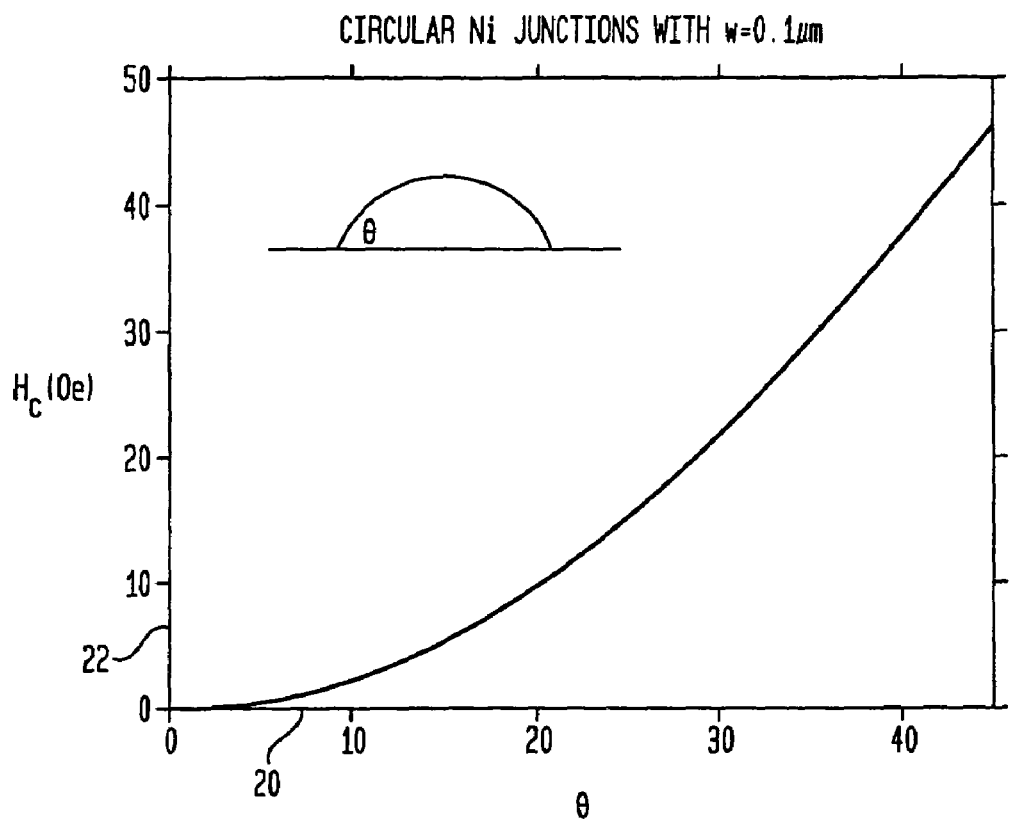
FIG. 2 is a graph of the coercivity of a magnetic memory cell constructed in accordance with a preferred embodiment of the present invention versus the angle of curvature of the free layer of the magnetic memory cell.

Referring now to FIG. 2, the relationship between the curvature 20 of the free layer of a circular junction magnetic memory cell versus the coercivity 22 of the memory cell using the material parameters of Ni (Nickel) is shown. As is clearly shown in the graph, the greater the curvature 20 of free layer, the greater the coercivity 22 of the junction. Furthermore, as noted above, the coercivity 22 is independent of the thickness of the free layer. Therefore, as the junctions are scaled to smaller lithographic line widths, w, the thickness can be proportionally increased to maintain the same volume. Since the volume does not decrease, the likelihood of thermally activated write errors is not increased. Thus, the use of a curved free layer over comes the prior art problems associated with magnetic memory cells that utilize traditional shape-induced anisotropy.

There are a number of ways in which the present invention can be implemented. First, grooves may be etched into the substrate as described in more detail above. The write wires for the magnetic memory cell can then be incorporated into these grooves. In such a situation, the write wires, typically constructed out of Copper (Cu), may be designed to be convex or concave in shape. A concave shape may be efficiently accomplished by performing a long chemical mechanical polish whereby a portion of Cu deposited in the grooves is removed. This is often referred to as "dishing". Alternatively, a thick free layer can be deposited and grooves etched in the free layer. The write wires are then deposited into the etched grooves in the free layer. Yet another possibility is to make nanogrooves in the substrate by polishing or ion beam etching. If the nanogrooves run in the easy axis direction only, and are roughly as long as the junctions, no "Neel Coupling" or "orange peel" effect related to unwanted interlayer magnetic coupling between the ferromagnetic layers due to their surface roughness is induced. Thus, there are a number of ways of producing a curved free layer in accordance with present invention.

Figure 3:
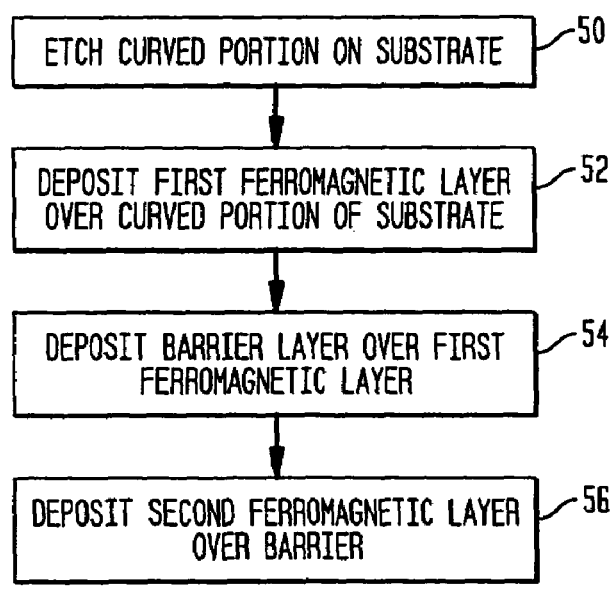
FIG. 3 is a flow chart of a preferred method of constructing a magnetic memory cell in accordance with a preferred embodiment of the present invention.

A preferred method of constructing a magnetic memory cell with a curved free region in accordance with the present invention is set forth in FIG. 3. The method commences in block 50 with the etching of a curved portion on a substrate. In block 52, a first ferromagnetic layer is deposited on the curved portion of the substrate. A barrier layer is then deposited over the first ferromagnetic layer in block 54. Finally, in block 56, a second ferromagnetic layer is deposited over the barrier layer. The curvature in the ferromagnetic layers induces a hard axis in the direction of the curve of the ferromagnetic layers and an easy axis that is perpendicular to the hard axis. Thus, forming the ferromagnetic layers such that they are curved in one direction creates a magnetic memory cell that beneficially exhibits uniaxial magnetic anisotropy.

Figure 4:
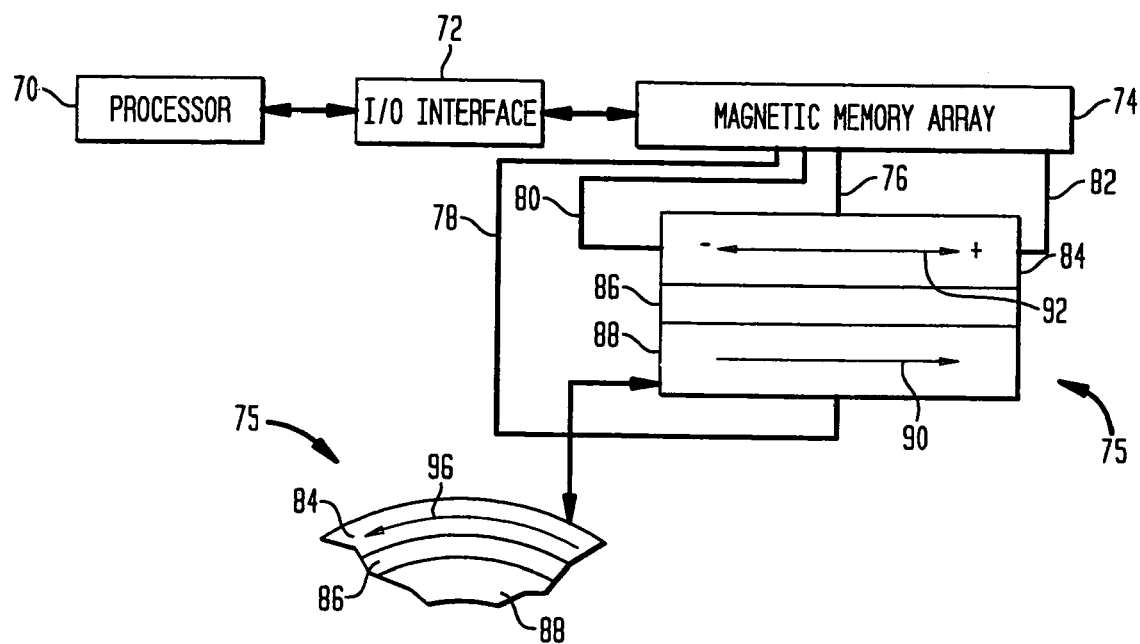
FIG. 4 is a diagram of a preferred information processing system constructed in accordance with an embodiment of the present invention.

Referring now to FIG. 4, a preferred information processing system utilizing the present invention is shown. The information processing system is controlled by a processor 70. The processor sends and receives information from a magnetic memory array 74 through an I/O interface 72. The magnetic memory array 74 has a number of magnetic memory cells 75. The magnetic memory cells 75 are constructed substantially straight in one direction to create an easy axis 92 and at least partially curved in a perpendicular direction to create a hard axis 96. Each magnetic memory cell 75 is constructed to have a free layer 84, a barrier layer 86 and a reference layer 88. The reference layer 88 has a fixed magnetization 90 that is predominantly oriented parallel to the easy axis 92. The free layer 84 also has a magnetization with an orientation predominantly parallel to the easy axis 92 that can be selectively altered between a positive and negative orientation by the processor 70 through the use of the write lines 80 and 82. The positive or negative orientation of the magnetization along the easy axis 92 in the free layer 84 determines the resistance of the magnetic memory cell 75 as measured between a pair of read lines 76 and 78. Since the curved free layer 84 of the memory cell 75 substantially confines the magnetization in the free layer 84 to running parallel to the easy axis 92, the resistance of the magnetic memory cell 75 will assume one of two approximate values depending upon the positive or negative orientation of the magnetization along the easy axis 92. These two approximate resistance values are used to respectively define a logical "1" and "0". Thus, the processor 70 can store binary information in the form of "1's" and "0's" in the magnetic memory array 74 through the I/O interface 72.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method of producing a magnetic memory cell having a free layer, a barrier layer and a reference layer, said method comprising steps of:

forming said free layer such that a portion of said free layer is curved, wherein said curved portion of said free layer is constructed by etching grooves in a substrate layer and depositing said free layer over said substrate layer, and forming a write wire in portions of said etched grooves.

2. The method of claim 1 wherein the step of forming said free layer further comprises steps of:

creating curved regions in the substrate layer; and depositing said free layer over said curved regions to produce said curved free layer.

3. The method of claim 1 further comprising producing said reference layer such that a portion of said reference layer is curved.

* * * * *